United States Patent [19]
Alivisatos et al.

[11] Patent Number: 5,537,000
[45] Date of Patent: Jul. 16, 1996

[54] ELECTROLUMINESCENT DEVICES FORMED USING SEMICONDUCTOR NANOCRYSTALS AS AN ELECTRON TRANSPORT MEDIA AND METHOD OF MAKING SUCH ELECTROLUMINESCENT DEVICES

[75] Inventors: A. Paul Alivisatos, Oakland, Calif.; Vickie Colvin, Springfield, N.J.

[73] Assignee: The Regents, University of California, Oakland, Calif.

[21] Appl. No.: 235,443

[22] Filed: Apr. 29, 1994

[51] Int. Cl.$^6$ ........................................... H05B 33/22
[52] U.S. Cl. .................. 313/506; 313/498; 313/499; 445/24; 445/58
[58] Field of Search .......................... 313/498, 499, 313/500, 501, 505, 506, 509; 445/23, 24, 58

[56] References Cited

U.S. PATENT DOCUMENTS

| | | | |
|---|---|---|---|
| 4,814,668 | 3/1989 | Tohda et al. | 313/499 |
| 5,200,668 | 4/1993 | Ohashi et al. | 313/499 |

OTHER PUBLICATIONS

Braun, D., et al., "Electroluminescence and Electrical Transport in Poly(3-octylthiophene) Diodes", *J. Appl. Phys.*, vol. 72, No. 2, Jul. 15, 1992, pp. 564–568.
Brown, A. R., et al., "Poly(p-phenylenevinylene) Light-Emitting Diodes: Enhanced Electroluminescent Efficiency Through Charge Carrier Confinement", *J. Appl. Phys.*, vol. 61, No. 23, Dec. 7, 1992, pp. 2793–2795.
Colvin, V. L., et al., "Semiconductor Nanocrystals Covalently Bound to Metal Surfaces with Self-Assembled Monolayers", *Journal of the American Chemical Society*, vol. 114, No. 13, 1992, pp. 5221–5230.
Tang, C. W., et al., "Electroluminescence of Doped Organic Thin Films", *J. Appl. Phys.*, vol. 65, No. 9, May 1, 1989, pp. 3610–3616.
Tang, C. W., et al., "Organic Electroluminescent Diodes", *Appl. Phys. Lett.*, vol. 51, No. 12, Sep. 21, 1987, pp. 913–915.

*Primary Examiner*—Nimeshkumar D. Patel
*Attorney, Agent, or Firm*—Paul R. Martin; Pepi Ross

[57] ABSTRACT

An electroluminescent device is described, as well as a method of making same, wherein the device is characterized by a semiconductor nanocrystal electron transport layer capable of emitting visible light in response to a voltage applied to the device. The wavelength of the light emitted by the device may be changed by changing either the size or the type of semiconductor nanocrystals used in forming the electron transport layer. In a preferred embodiment the device is further characterized by the capability of emitting visible light of varying wavelengths in response to changes in the voltage applied to the device. The device comprises a hole processing structure capable of injecting and transporting holes, and usually comprising a hole injecting layer and a hole transporting layer; an electron transport layer in contact with the hole processing structure and comprising one or more layers of semiconductor nanocrystals; and an electron injecting layer in contact with the electron transport layer for injecting electrons into the electron transport layer. The capability of emitting visible light of various wavelengths is principally based on the variations in voltage applied thereto, but the type of semiconductor nanocrystals used and the size of the semiconductor nanocrystals in the layers of semiconductor nanometer crystals may also play a role in color change, in combination with the change in voltage.

50 Claims, 4 Drawing Sheets

```
┌─────────────────────────────────┐
│ A METHOD OF FORMING AN          │
│ ELECTROLUMINESCENT DEVICE       │
│ CAPABLE OF CHANGING COLOR       │
│ IN RESPONSE TO VOLTAGE          │
│ CHANGE WHICH COMPRISES:         │
└─────────────────────────────────┘
              │
┌─────────────────────────────────┐
│ FORMING A HOLE INJECTING        │
│ LAYER ON A SUPPORT              │
└─────────────────────────────────┘
              │
┌─────────────────────────────────┐
│ FORMING A HOLE TRANSPORT        │
│ LAYER IN CONTACT WITH THE       │
│ HOLE INJECTING LAYER            │
└─────────────────────────────────┘
              │
┌─────────────────────────────────┐
│ FORMING AN ELECTRON TRANSPORT   │
│ LAYER COMPRISING SEMICONDUCTOR  │
│ NANOCRYSTALS IN CONTACT WITH    │
│ THE HOLE TRANSPORT LAYER        │
└─────────────────────────────────┘
              │
┌─────────────────────────────────┐
│ FORMING AN ELECTRON INJECTING   │
│ LAYER IN CONTACT WITH THE       │
│ ELECTRON TRANSPORT LAYER TO     │
│ COMPLETE FORMATION OF THE DEVICE│
└─────────────────────────────────┘
```

FIG. 9

ELECTROLUMINESCENT DEVICES FORMED USING SEMICONDUCTOR NANOCRYSTALS AS AN ELECTRON TRANSPORT MEDIA AND METHOD OF MAKING SUCH ELECTROLUMINESCENT DEVICES

BACKGROUND OF THE INVENTION

The invention described herein arose in the course of, or under, Contract No. DE-AC03-SF00098 between the United States Department of Energy and the University of California for the operation of the Lawrence Berkeley Laboratory. The Government may have rights to the invention.

1. Field of the Invention

This invention relates to electroluminescent devices and a method of making same. More particularly, this invention relates to electroluminescent devices formed using one or more layers of semiconductor nanocrystals as an electron transport layer, and preferably capable of emitting voltage-dependent visible light of various wavelengths.

2. Description of the Related Art

Electroluminescent devices such as light emitting diodes (LEDs) have been constructed in the past using P-doped and N-doped materials. However, such devices are generally only capable of emitting color of a particular wavelength based on the semiconductor materials used in the diode. Electroluminescent devices have also been made using a polymeric material such as poly-(p-phenylene vinylene) (PPV) as a hole transport layer between a hole injection electrode and an electron injection electrode. However, such devices are also limited to emission of a single color, based on the type of light emitting polymeric material utilized. Thus, to vary the color, one must use a different polymer, which prevents, or at least complicates, the display of light of various colors. Furthermore, since such polymeric materials do not function as electron transport media, the recombination of holes and electrons, which results in such light emission, occurs adjacent the electron injection electrode, which tends to lower the efficiency of the device as a light source.

An electroluminescent device which addresses this low efficiency problem has been proposed by Brown et al. in an article entitled "Poly(p-phenylenevinylene) light-emitting diodes: Enhanced electroluminescent efficiency through charge carrier confinement", published at Appl. Phys. Lett. 61(23) pp. 2793–2795, 1992. Brown et al. teach a device wherein a hole transport layer comprising PPV is separated from the electron injection electrode by an electron transport layer formed using a 2-(4-biphenylyl)- 5-(4-tert-butylphenyl)-1,3,4-oxadiazole (butyl PBD) molecule dispersed in a poly(methyl methacrylate) (PMMA) polymer. While such a device might provide a higher efficiency than conventional polymeric light emitting devices, it still is limited to the emission of light of a single wavelength by excitation of the polymeric material comprising the hole transport layer.

Tang et al., in an article entitled "Electroluminescence of doped organic thin films", J. Appl. Phys. 65 (9), 1 May 1989, pp. 3610–3616, teaches a device that emits light at different wavelengths by doping an organic transporter such as 8-hydroxyquinoline aluminum with a dye molecule. Light, however, is still limited to emission at the wavelength of that dye molecule. Furthermore the processing technology taught by Tang et at. requires evaporation of the organic molecules, which may be difficult.

It would, therefore, be advantageous to provide an electroluminescent device capable of emitting light of various visible wavelengths in response to external stimulus. More particularly, it would be advantageous to provide such an electroluminescent device wherein variations in voltage would result in change of color of the light emitted by the device. It would be particularly advantageous if the light emitting material was an inorganic material capable of withstanding higher temperatures than the conventional organic polymeric materials.

SUMMARY OF THE INVENTION

The invention comprises an electroluminescent device characterized by the capability of emitting visible light in response to excitation of semiconductor nanocrystals. The wavelength of the emitted light may be varied by varying the type and/or crystal size of the semiconductor nanocrystals. The electroluminescent device can be constructed to emit more than one wavelength of light based on changes in voltage applied to the device. The device comprises hole processing means capable of injecting and transporting holes; electron transport means in contact with the hole processing means comprising one or more layers of semiconductor nanocrystals; and electron injecting means in contact with the electron transport means for injecting electrons into the electron transport means. The capability of a single device to emit visible light of various wavelengths is principally based on the variations in voltage applied thereto, but the type of semiconductor nanocrystals used and the size and/or size distribution of the semiconductor nanocrystals in the layers of semiconductor nanocrystals can also play a role in color change, in combination with the change in voltage. The electroluminescent device of the invention is further characterized by its ease of fabrication, in comparison with prior art devices; and more efficient electron transport rate through the semiconductor nanocrystal electron transport layer than through prior art electron transport layers.

BRIEF DESCRIPTION OF THE DRAWINGS

FIG. 9 is a flow sheet illustrating the steps of constructing the electroluminescent device of the invention.

DETAILED DESCRIPTION OF THE INVENTION

Figure 1:
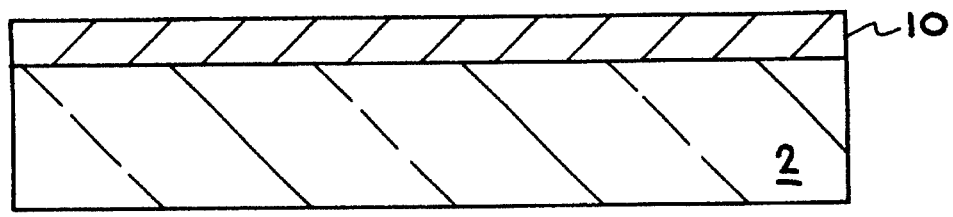
FIGS. 1–4 are sequential vertical cross-section views of the step by step construction of the electroluminescent device of the invention.

The invention comprises an electroluminescent device characterized by an electron transport layer comprising semiconductor nanometer crystals. The device is capable of emitting visible light by excitation of the semiconductor nanocrystals in the electron transport layer. In one embodiment, the wavelengths of emitted light are dependant upon the voltage applied to the device. The light emission spectrum of emitted visible light may also be tuned by selection of the type of semiconductor or semiconductors present in the layer of semiconductor nanocrystals, as well as by variations in the size of the semiconductor nanometer crystals used to form the electron transport layer.

By use of the term "nanometer crystals" or "nanocrystals" herein is meant single crystal particles having an average cross-section no larger than about 20 nanometers (nm) or $20 \times 10^{-9}$ meters (200 Angstroms), preferably no larger than about 10 nm (100 Angstroms) and a minimum average cross-section of about 1 nm, although in some instances smaller average cross-section nanocrystals, i.e., down to about 0.5 nm (5 Angstroms), may be acceptable. Typically the nanocrystals will have an average cross-section ranging in size from about 1 nm (10 Angstroms) to about 10 nm (100 angstroms).

By use of the term "semiconductor crystals" is meant nanometer crystals of Group II-VI and Group III-V semiconductor compounds capable of emitting light upon excitation, although the use of Group IV semiconductors may be feasible under certain conditions.

The electroluminescent device of the invention comprises a hole processing layer; a semiconductor nanocrystal electron transport layer; and an electron injection layer. In one embodiment, both the hole processing layer and the semiconductor nanocrystal electron transport layer will, in addition, also be transparent to visible light of the wavelengths emitted by the semiconductor nanocrystal layer, while the electron injection layer will preferably be capable of reflecting visible light emitted by the semiconductor nanocrystal layer.

The hole processing layer will include the capability of hole injection as well as hole transport. While the hole processing layer will usually comprise two layers, respectively having the capability of hole injection and hole transport, such capabilities may be present in a single layer. For example, when a layer of a doped silicon material e.g., a P-doped silicon layer is used as the hole processing layer, the layer will exhibit both hole injection and hole transport properties. Usually, however, the hole injection layer and hole transport layer will comprise two different layers contiguous to one another.

The use of the terms "hole" and "holes" herein is intended to refer to the vacant electron energy states near the top of an energy band in a solid.

It should be noted in this regard, that while the following description of the preferred embodiment of the electroluminescent device of the invention will be directed toward a device viewed through a transparent hole injection layer and a transparent hole transport layer, the structure could be formed to be viewed from the electron injection side of the device, in which case the electron injection layer would be transparent to permit viewing of the light. In such a case, the electron injection layer would be formed thin enough, e.g., about 100 Å, to be transparent. In such an embodiment of the electroluminescent device of the invention, a P-doped silicon layer, such as just described above, can used as the hole processing layer, i.e., a layer exhibiting both hole injection and hole transport properties. Such a P-doped silicon layer could then be made thick enough to provide a reflective coating to enhance the emitted light in the electron transport layer.

It should also be noted that it is within the scope of the invention to construct a device wherein the emitted light is viewed from the side of the device, in which case it is possible that both the hole processing layer(s) and the electron injection layer may be constructed of non-transparent material.

The device of the invention, i.e., a device with an electron injection layer, a semiconductor nanocrystal electron transport layer, and a hole processing layer (which may comprise either a single layer or separate hole injection and hole transport layers) will be described below principally with regard to its unusual feature of being able to exhibit change in color based on change in applied voltage (either when a hole transport layer capable of emitting light is also used, or where separate layers of semiconductor nanocrystals are employed, which emit light of varying wavelength). However, it is within the scope of the invention to employ the semiconductor nanocrystals in a device operated at a single voltage to emit light of a single wavelength, with the use of such semiconductor nanocrystals as the light-emitting source providing a wider selection of colors (by changing either the crystal size or the type of semiconductor nanocrystals) without substantially varying the process of forming the device, as well as providing a higher electron transport rate through the semiconductor nanocrystal electron transport layer and enhanced efficiency in light emission.

a. The Hole Injection Layer or Electrode

Referring now to the drawings, FIGS. 1–4 show a step by step formation of a preferred embodiment of the electroluminescent device of the invention. In FIG. 1, a transparent support media or substrate, such as a transparent glass plate 2 is shown having a hole injection layer or electrode 10 deposited thereon. While, as stated above, hole injection and hole transport functions may be found in the same material, usually the hole injection layer and hole transport layer will comprise two different layers contiguous to one another. Examples of materials which can be used as transparent hole injection layer or electrode 10 include indium tin oxide, having an indium/tin ratio of about 1:1 and a thickness of from about 1000 Angstroms to about 3000 Angstroms; gold, having a thickness ranging from 50 Angstroms to about 150 Angstroms; silver, having a thickness ranging from about 50 Angstroms to about 150 Angstroms; and copper, having a thickness ranging from about 50 Angstroms to about 150 Angstroms. Examples of other transparent materials capable of functioning as hole injection materials include p type zinc oxide, and other p-type semiconductors having a band gap greater than 3 eV. Glass plates having transparent 2000 Angstrom indium/tin oxide layers already formed thereon are commercially available from Donnely and Company.

b. The Hole Transport Layer

Figure 2:
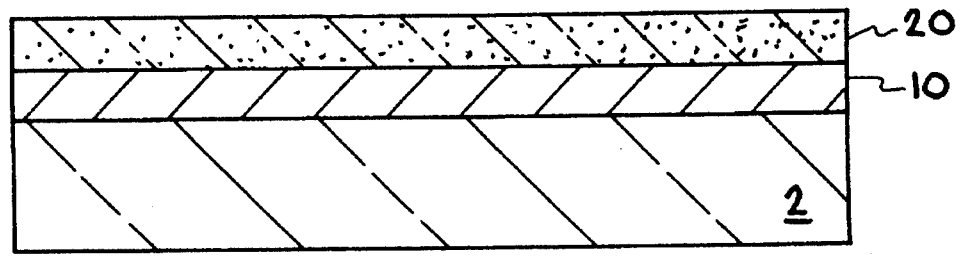

Turning now to FIG. 2, after formation of the structure of FIG. 1, a hole transport layer 20 is formed over hole injection layer 10 (unless a single material is being utilized to accomplish both functions). Hole transport layer 20 comprises a material capable of transporting the injected holes at least partially through the layer toward the junction between the hole transport layer and the electron transport layer until the holes are recombined with the electrons which are also injected into the device and which are traveling through the electron transport layer toward the hole transport layer/electron transport layer junction.

Materials which may be used in the construction of hole transport layer 20 include conductive polymers such as poly-p(paraphenylene) (PPV) a transparent electrically conductive polymer having an average molecular weight of about 100,000 Daltons. Other conductive polymers which may be used in the construction of hole transport layer 20 include poly(3-alkylthiophene), the formation of which is described by Yoshimo, Jpn. J. A. Phys. 23, L899 (1984); or poly(3-octylthiophene), the formation of which is described by D. Braun in "Electroluminescence and electrical transport in poly(3-octylthiophene)", J. A. Phys. 72(2), pp. 564–568. Other transparent conductive materials, which are not polymers, but which are also capable of serving as the transparent hole transport layer include any p-type semiconductors having a band gap greater than 3 eV.

The thickness of the hole transport layer should be at least about 20 nm. (200 Angstroms) to provide sufficient separation of at least a portion of hole transport layer 20 from hole injection source 10 to prevent hole injection layer or electrode 10 from adversely influencing the efficiency of the light emission or quenching it. Since the recombination zone shifts from the electron transport layer to the hole transport layer with increased voltage, the overall thickness of the hole transport should not effect such a shift, as will the overall thickness of the electron transport layer, as will be discussed below. However, an excessive thickness should not be used, since this may interfere with the transmission of emitted light therethrough, particularly when the light is emitted in the electron transport layer. Preferably, therefore, the thickness of hole transport layer 20 will not exceed about 200 nm. (2000 Angstroms).

When hole transport layer 20 comprises a light emitting polymeric material, layer 20 may be formed over hole injection layer 10 on substrate 2 by making a liquid solution or suspension of a prepolymer; applying such a solution, suspension, dispersion, etc. to the surface of hole injection layer 10 by any suitable application means, such as, for example, by spin coating the liquid over layer 10; and then heating the coated structure to drive off the liquid and to polymerize the prepolymer coating. The thickness of hole transport layer 20 may then be controlled by the viscosity of the coating material; by the number of coating layers applied; and the speed, when spin coating techniques are employed.

c. The Electron Transport Layer

Figure 3:
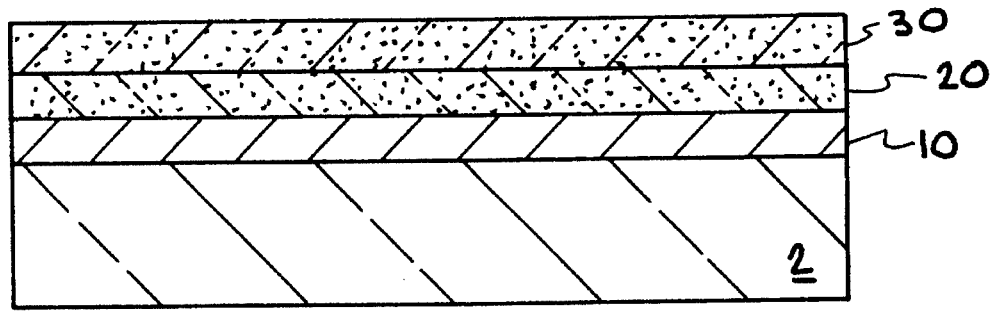

After formation of hole transport layer 20 over hole injection layer 10 on substrate 2, electron transport layer 30 is formed over hole transport layer 20, as shown in FIG. 3. Electron transport layer 30 is formed using semiconductor nanometer crystals formed from semiconductor materials capable of emitting visible light when excited by electrons or photons, and preferably from direct gap type semiconductors, where "direct gap" is defined, for this purpose, as a semiconductor material capable of emitting band gap radiation upon excitation.

Preferably the semiconductor nanocrystals comprise Group II-VI semiconductor compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe; HgS, HgSe, and HgTe; and/or crystals of Group III-V semiconductor compounds such as GaAs, InAs, InP, and InSb; and/or, in some instances, mixtures of two or more of such semiconductor compounds. In some instances, transparent Group IV semiconductor nanocrystals, such as germanium or silicon may also be utilized.

Formation of nanometer crystals of Group III-V semiconductors is described in copending and commonly assigned Alivisatos et al. Ser. No. 07/796,246 (now pending as Ser. No. 08/231,345), filed Nov. 11, 1991; and Alivisatos et at. U.S. Pat. No. 5,262,357, which also describes the formation of Group II-VI semiconductor nanocrystals, and which is also assigned to the assignee of this invention. Also described therein is the control of the size of the semiconductor nanocrystals during formation using crystal growth terminators. The teachings of Alivisatos et at. Ser. No. 07/796,246 (now pending as Ser. No. 08/231,345), and Alivisatos et at. U.S. Pat. No. 5,262,357 are each hereby specifically incorporated by reference.

The semiconductor nanocrystals are formed into one or more monolayers by any known technique capable of causing the semiconductor nanocrystal particles to bond, as a monolayer, to the underlying substrate or support material, and then, in subsequent monolayers, to one another. One such technique is the treatment of either the nanocrystals or the support with multifunctional linking agents which cause the nanocrystals to bond to the linking agent which, in turn, bonds to the substrate or support, to form the first monolayer, with linking agents then used again to bond the first monolayer of nanocrystals to a subsequent nanocrystal monolayer. Such a technique is more fully described in copending Alivisatos et al U.S. patent application Ser. No. 07/796,245 (now pending as Ser. No. 08/235,265), filed Nov. 22, 1991, and assigned to the assignee of this invention, and the disclosure of which is hereby incorporated by reference.

Described therein are multifunctional linking agents such as, for example, difunctional thiols, and linking agents containing a thiol group and a carboxyl group. In particular, preferred dithiols described are those having the formula H-S-R-S-H, where R is an organic group which provides sufficient spacing between the sulfur atoms at the opposite ends of the molecule to permit the respective thiol groups on the opposite ends of the molecules to respectively bond to adjacent nanocrystals, or to a nanocrystal at one end and a substrate or support surface on the other end. Thus, R may comprise an organic moiety, such as an alkylene or an arylene, containing from 4 to 8 carbon atoms, and preferably from abut 5 to 7 carbon atoms. Examples of such dithiol organic compounds include 1,4-dithiol n-butane; 1,5-dithiol n-pentane; 1,4-dithiol cyclohexane; 1,6-dithiol n-hexane; 1,7-dithiol n-heptane; and 1,8-dithiol n-octane. Such shorter chain molecules are preferred over longer chain molecules to prevent or inhibit the linking agent from doubling back to adhere on both ends to the material to which the semiconductor nanocrystals is being bonded. However, it may be possible to also use longer chain linking agents in some instances, particularly when multiple monolayers of the nanocrystals are being applied over a support media.

Figure 6:
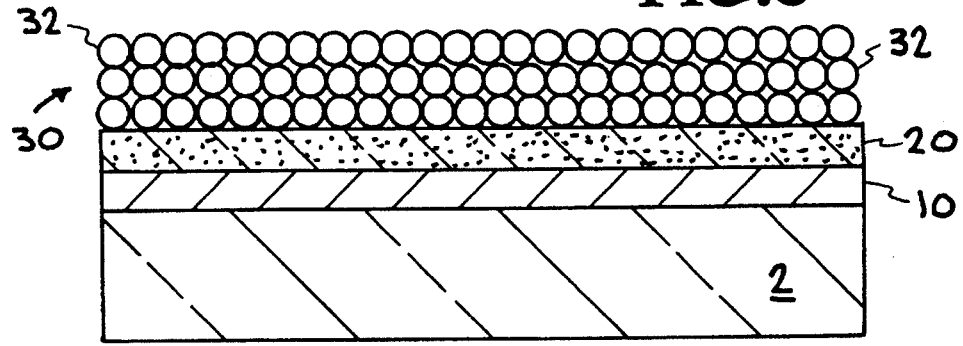
FIG. 6 is a vertical cross-sectional view illustrating a simplified form of construction of the electron transport layer comprising several layers of semiconductor nanocrystals of the same particle size and semiconductor type.

Preferably, electron transport layer 30 will comprise a plurality of monolayers of semiconductor nanocrystals, e.g., at least about 3–4 monolayers, as shown in FIG. 6, since the visible light emitting capabilities of the semiconductor nanocrystal layer or layers closest to the electron injection source have been found to be quenched by the proximity of the electron injection layer or source. The number of monolayers formed over hole transport layer 20 may be controlled by controlling the amount of semiconductor nanocrystal material (treated with the linking agent) applied over hole transport layer 20. The number of monolayers (and thereby the thickness of layer 30) may also be controlled by first treating the surface of layer 20 with the linking agent, then applying a sufficient amount of untreated semiconductor nanocrystal material to bond with the linking agent to thereby form a first monolayer of semiconductor nanocrystals thereon, and then applying further linking agent to the first monolayer and applying a second monolayer of untreated semiconductor nanocrystals thereover, with these steps repeated until the desired thickness of layer 30 has been achieved.

The total thickness of electron transport layer 30 should be at least about 20 nm. (200 Angstroms) to ensure that the recombination zone, at a low voltage, i.e., a voltage of 1–2 volts will be in layer 30, but not so close to the electron injection electrode or layer so as to quench or unduly attenuate the light level of the light emitted by the semiconductor nanocrystals during the excitation which occurs when the holes and electrons recombine. On the other hand, for the simple case where the recombination zone is to be shifted to the hole transport layer (for excitation of a light-emitting polymer therein resulting in an emission of light of different wavelength) by raising the voltage across the device, it is important that the total thickness of electron transport layer 30 not exceed about 100 nm. (1000 Angstroms). If layer 30 is thicker, the recombination zone, while shifting with an increase in voltage, may not shift sufficiently to cross the junction between electron transport layer 30 and hole transport layer 20. For a homogeneous electron transport layer of semiconductor nanocrystals, this could result in no change in color. However, as will be explained below, in certain circumstances such a shift in the recombination zone, without leaving the electron transport layer, may be acceptable or even desirable.

d. The Electron Injection Layer or Electrode

Figure 4:
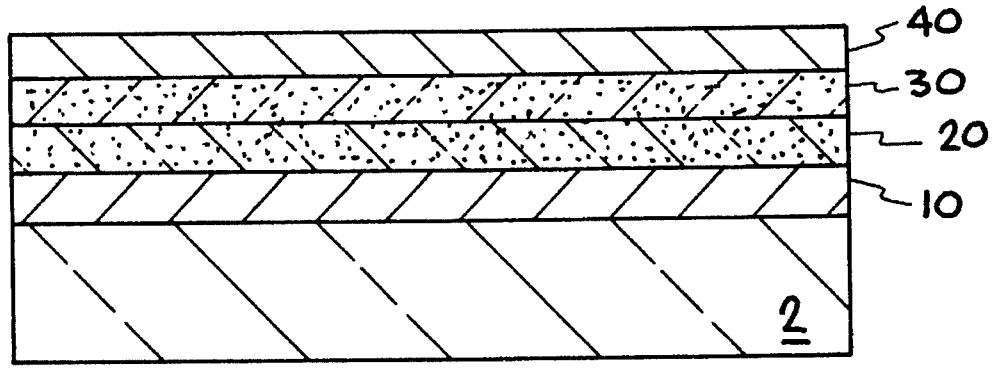

Turning now to FIG. 4, an electron injection layer or electrode 40 is now formed over electron transport layer 30. Electron injection layer 40 may comprise any metal or N-doped semiconductor layer capable of injecting electrons into the previously described electron transport layer. In a preferred embodiment, electron injection layer 40 comprises an alkaline earth metal such as magnesium, calcium, strontium, or barium. Other metals capable of serving as electron injection electrode 40 include indium, magnesium indium alloys, and aluminum. Preferably, metal layer 40 is applied over the top surface of electron transport layer 30 by evaporation of the metal in vaporized form, e.g., by chemical vapor deposition (CVD) or physical vapor deposition (PVD) techniques, with deposits of as little as 10 nm. (100 Angstroms) being of sufficient thickness to provide the desire injection of electrons into the device.

While electron injection layer 40 need not be transparent in the embodiment portrayed in FIGS. 1–4, in this embodiment it is preferable that the electron injection layer be reflective so that the visible light emitted by the electron transport layer (or the hole transport layer), upon recombination of the holes and electrons in the device, will be reflected back through the transparent layers to be viewable by one observing the electroluminescent device from the hole processing side of the device, e.g., through transparent glass 2.

e. Operation of the Electroluminescent Device

Figure 5:
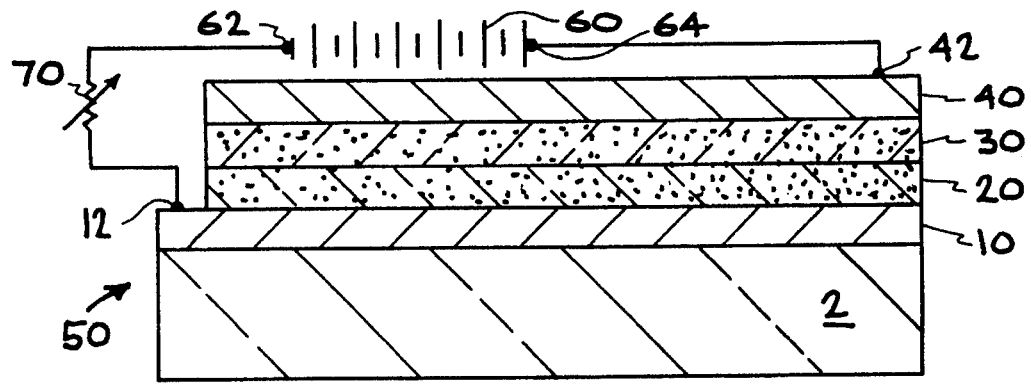
FIG. 5 is a schematic illustration of the electroluminescent device of the invention connected to an external electric power source.

Turning now to FIG. 5, the electroluminescent device just described is generally shown at 50 connected to an external DC power supply 60 in series with a variable resistor (potentiometer) 70, with the terminal 62 of power supply 60 connected at 12 to hole injection electrode 10 and terminal 64 of power supply 60 connected through potentiometer 70 to electron injection electrode 40 at 42. When potentiometer 70 is adjusted to provide a voltage of about 2 volts between connection points 12 and 42, the recombination zone will fall in electron transport layer 30, and then will gradually shift toward the junction between hole transport layer 20 and electron transport layer 30, and then into layer 20, as the voltage is increased. When, for example, the semiconductor nanocrystals in layer 30 comprise cadmium selenide and the material in hole transport layer 20 comprises PPV, visible light of yellow wavelength is observed when a voltage of about 4 volts is applied between point 12 and 42, indicating that the recombination zone is still within the CdSe electron transport layer. When the voltage, however, is raised to 6 volts, the wavelength of the emitted light shifts to green, indicating that the recombination zone has shifted to hole transport layer 20 and the PPV material is being excited.

f. Other Embodiments of the Electron Transport Layer

While the foregoing describes the simplest case wherein the recombination zone shifts from visible light emitting electron transport layer, comprising semiconductor nanocrystals, to a visible light emitting hole transport layer, such as a visible light emitting polymer layer, it is also within the scope of this invention to provide an electroluminescent device with a composite electron transport layer wherein a color shift of emitted visible light can occur, with change in voltage, without the recombination zone leaving the composite electron transport layer. As shown in FIG. 6, electron transport layer 30 actually comprises a series of monolayers, so that the recombination zone may be spaced from electron injection electrode 40 to avoid suppression or quenching of the emission of visible light by the semiconductor nanocrystals in electron transport layer 30.

However, as also depicted in FIG. 6, in the simplest case, semiconductor nanocrystals 32 all comprise crystals of the same semiconductor compound and generally all of the same size, resulting in emission of visible light of the same wavelength, regardless of the location of the recombination zone in electron transport layer 30. Thus, in the embodiment shown in FIG. 6, for a change of color to occur, with a change in voltage, the recombination zone must be shifted from the electron transport layer to the hole transport layer.

It should, perhaps, be noted that while three monolayers of semiconductor nanocrystals are shown in FIG. 6, this is for illustration purposes only, and not by way of any intended limitation. Layer 30 might comprise only 2–3 monolayers of semiconductor nanocrystals, or as many as 50 of such monolayers.

Figure 7:
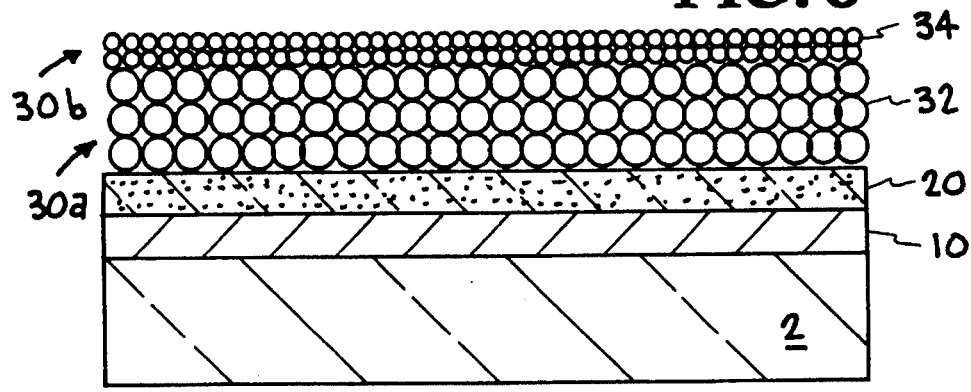
FIG. 7 is a vertical cross-sectional view illustrating a construction of an alternate embodiment of the electron transport layer of the invention comprising a composite electron transport layer composed of layers of semiconductor nanocrystals of various particle sizes to provide further variations in wavelengths of emitted light.

In another embodiment of the invention, however, a composite electron transport layer may be formed, as shown in FIG. 7, comprising a first electron transport layer portion 30a, comprising a series of semiconductor nanocrystals 32 of one crystal size, i.e., as in FIG. 6, and a second electron transport layer portion 30b comprising a series of semiconductor nanocrystals 34 of the same type, but of a different crystal size within the general range of 1 nm. (10 Angstroms) to 100 nm. (1000 Angstroms).

Thus, for example, first electron transport layer portion 30a, may comprise a series of monolayers of 8 nm. nanocrystals of CdSe; while second electron transport layer portion 30b may comprise a series of monolayers of 2 nm. nanocrystals of CdSe. When the voltage is low enough, e.g., 2 volts, the recombination zone may be in first electron transport layer portion 30a, resulting in the emission of visible light of a first wavelength; while raising the voltage across the device, e.g., by raising the voltage to 6 volts, may result in a shift of the recombination zone into second electron transport layer portion 30b, which may result in a shift of the wavelength of the emitted light, resulting in an observed color change based on a change in voltage, without, however, a shift of the recombination zone into hole transport layer 20.

This, for example, permits the use of non-light emitting materials for hole transport layer 20, or at least the use of non-visible light emitting materials for layer 20. Again, while the use of only several monolayers of each size of semiconductor nanocrystals is shown, it will be realized that this is only by way of illustration, and not of limitation. Furthermore, while the use of two different sizes of semiconductor nanocrystals are illustrated, more than two sizes of semiconductor nanocrystals could be employed, if desired.

Figure 8:
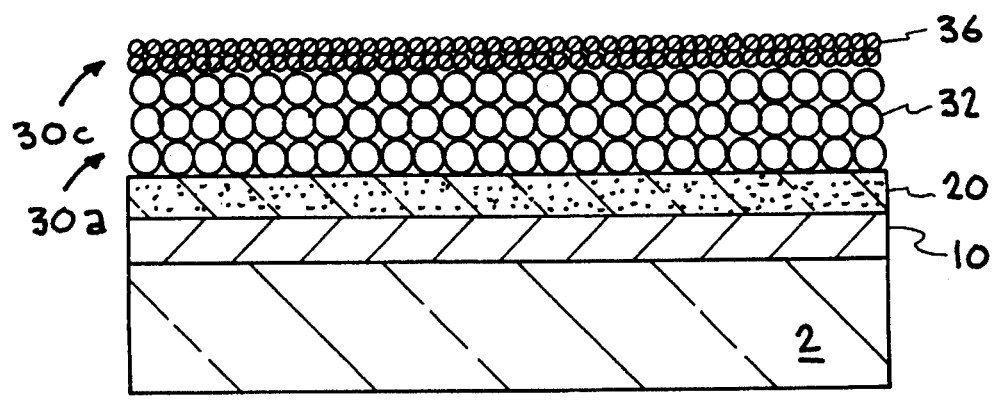
FIG. 8 is a vertical cross-sectional view illustrating a construction of another embodiment of the electron transport layer of the invention comprising a composite electron transport layer composed of layers of various types of semiconductor nanocrystals to provide further variations in wavelengths of emitted light.

Turning to FIG. 8, yet another embodiment of the invention is illustration wherein the type of semiconductor nanocrystal, rather than the crystal size, is varied from one portion of the composite semiconductor nanocrystal layer to another. In this embodiment, for example, a first series of monolayers of CdSe semiconductor nanocrystals 32 may comprise first electron transport layer portion 30a, while a second series of monolayers of GaAs semiconductor nanocrystals 36 may comprise a second electron transport layer portion 30c.

As in the previous embodiment of FIG. 7, a voltage change, resulting in a shift of the recombination zone from first electron transport layer portion 30a to second electron transport layer portion 30b may result in a shift of the spectrum of emitted light, resulting in an observed color shift from such a change in voltage, without however, shifting the recombination zone out of the electron transport layer into the hole transport layer, resulting in the same advantages as described above for the embodiment of FIG. 7. Similarly to the comments made above regarding the previous embodiment, while only a few monolayers of each type of semiconductor nanocrystals are shown, this is only by way of illustration, and not of limitation. Furthermore, while the use of two different types of semiconductor nanocrystals are illustrated, more than two types of semiconductor nanocrystals could be employed, if desired.

It should be further noted that if desired and advantageous, the use of different sizes of semiconductor nanocrystals, as well as different types of semiconductor nanocrystals, may be employed simultaneously in the same device, if desired, to still further vary the desired color change based on voltage shift, in accordance with the invention. Furthermore, the sizes and/or types of semiconductor nanocrystals used may be mixed together, e.g., in the same monolayer, to achieve a different shade of color, for example, by blending the simultaneous emitted light from two different sizes of the same type of crystal at the same voltage, or by blending together the emitted light from two different type of semiconductor nanocrystals at the same applied voltage.

To further illustrate the invention, indium-tin oxide (ITO) glass, having a resistivity of 25 Ω-cm, was obtained from Donnely and Company and cleaned in acetone/isopropanol. The ITO-coated glass samples were spin coated at 3000 rpm with solutions of precursor PPV three times, making a transparent film on the coated glass substrate. The samples were then heated in vacuo for six hours to convert the precursor PPV to the yellow semiconducting PPV polymer. After conversion and cooling, the samples were removed from the vacuum oven and placed in a 5 mM solution of hexane dithiol in isopropanol for 12 hours. They were then rinsed with isopropanol for one minute and placed in a solution of 33 Å diameter CdSe clusters (nanocrystals) (~1 mg. CdSe/50 ml. Toluene) dissolved in toluene. After 12 hours the samples were removed and rinsed for one minute in toluene and then placed in the hexane dithiol solution again. The entire hexane dithiol/CdSe nanocluster deposition procedure was repeated five times. After thorough drying, magnesium was evaporated onto the PPV/CdSe nanocrystal sample. Electrical connections were made between the ITO electrode and the magnesium electrode to a low voltage DC source, with the positive electrode of the DC source connected to the ITO electrode. The devices were found to have turn-on voltages of 4 volts and emitted yellow light at 580 nm, characteristic of the 33 Å CdSe nanocrystals. When the voltage applied to the devices was raised to 7 volts, the devices emitted green light, principally at 530 nm, characteristic of the PPV material, indicating that the recombination zone had shifted to the PPV layer.

When the same procedure was repeated using, however, 49 Å diameter CdSe nanocrystals, the resulting samples emitted red light at 630 nm, when 4 volts was applied to the sample devices. When 42 Å diameter CdSe nanocrystals were substituted, the samples emitted reddish-orange light at 616 nm upon application of 4 volts; and when 37 Å diameter CdSe nanocrystals were substituted, the samples emitted orange light at 602 nm at volts.

Figure 10A:
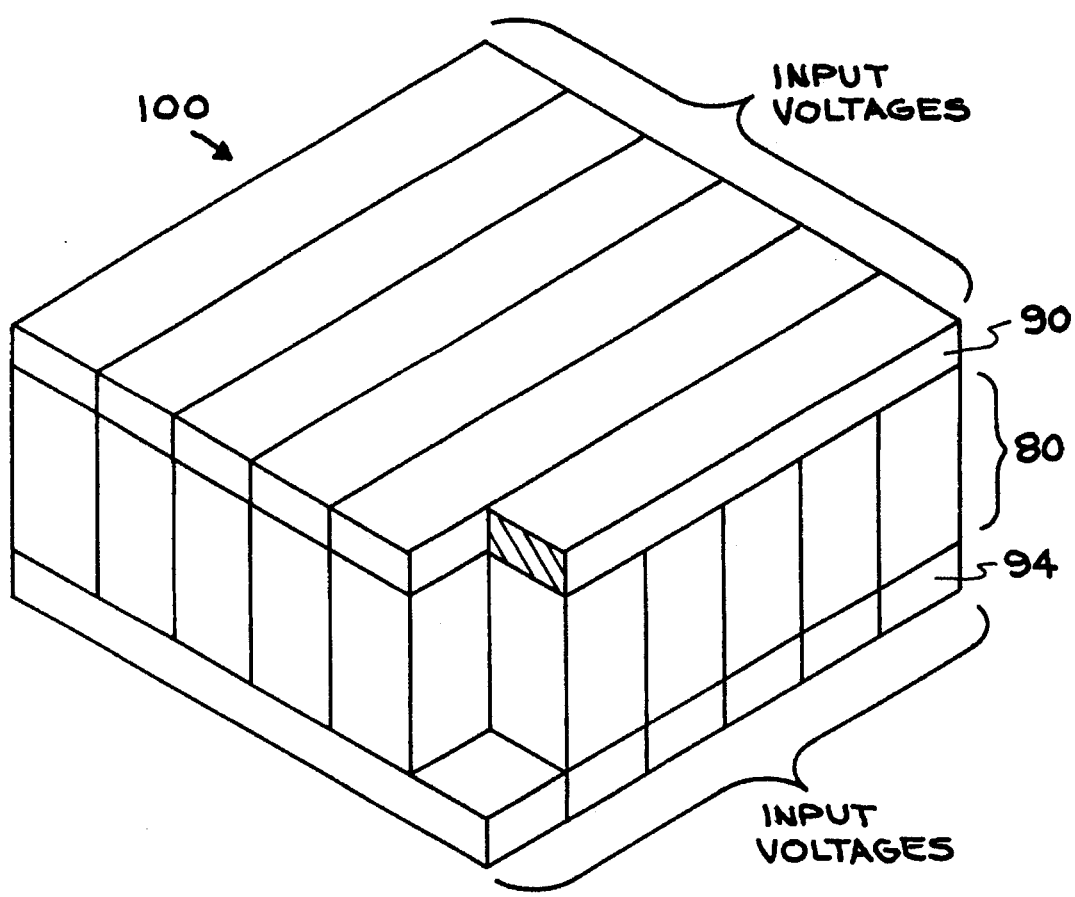
FIG. 10A illustrates a partially cutaway flat-panel display device for providing an image utilizing light from a plurality of the electroluminescent devices in accordance with the present invention.
Figure 10B:
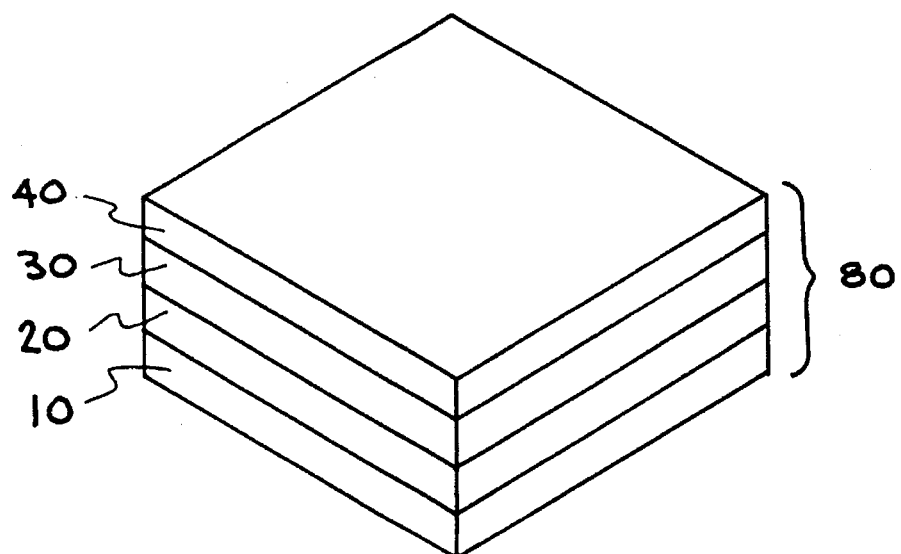
FIG. 10B is a sectioned view of one of the electroluminescent devices shown in the fla-panel display device of FIG. 10A.

The electroluminescent devices of the present invention, as illustrated in FIGS. 10A and 10B, may be utilized to provide a novel flat-panel display device for providing an image utilizing emitted light from a plurality of the electroluminescent devices arranged, for example, in a two dimensional array. Flat-panel display device 100 shown in FIG. 10A includes: a first electronic control input unit 90, a second electronic control input unit 94, and a plurality of electroluminescent devices 80. First electronic control input unit 90 and second electronic control input unit 94 are each operably coupled to an external source (not shown) to receive one or more input signals for controlling the plurality of electroluminescent devices 80. The plurality of electroluminescent devices 80 are, in turn, each operably coupled to first electronic control input unit 90 and to second electronic control input unit 94.

As seen in FIG. 10B, each electroluminescent device 80 shown in flat-panel display device 100 shown in FIG. 10A has a hole processing means capable of injecting and transporting holes and may comprise, for example, a single layer, or separate layers such as layers 10 and 20, as also seen in FIGS. 2–8. Each electroluminescent device 80 further comprises an electron transport means, such as, for example, layer 30, as also seen in FIGS. 3–8, in contact with the hole processing means comprising one or more monolayers of semiconductor nanocrystals; and electron injecting means, such as, for example, layer 40, as also seen in FIGS. 4–5, in contact with the electron transport means for injecting electrons into the electron transport means, wherein the first and second electronic control input units are arranged to respectively provide voltages across preselected portions of the plurality of electroluminescent devices 80 to provide a desired image.

In one embodiment, the first and second electronic control input units may be selected to provide respective planes of parallel electrodes, as seen in FIG. 10A, with the parallel electrodes of the first electronic control input unit being disposed perpendicular to the parallel electrodes of the second electronic control input unit, and having the electroluminescent devices located between the respective planes of parallel electrodes of the first and second electronic control input units. Preferably the parallel electrodes on at least one side of the array of electroluminescent devices will be transparent to the light emitted by the devices. In one selected embodiment, at least one of the first and second electronic control input units receives an active matrix drive signal addressing data to drive all or a portion (240 rows by 640 columns) of a video graphics array (VGA).

Thus, the invention provides an electroluminescent device, a method of making same, and a flat-panel display formed using a plurality of such electroluminescent devices, wherein monolayers of semiconductor nanocrystals are used for the electron transport layer of the device, wherein various colors can be achieved by the use and excitation of various types of such semiconductor nanocrystals and/or by varying the crystal size of the excited nanocrystals. In a particular embodiment, color change may also be achieved in a single device, based on a shift in the applied voltage across the device, by the use of semiconductor nanocrystals to form the electron transport layer between an electron injection layer or electrode, and a hole processing layer or layers; whereby the resulting recombination zone may be located within the electron transport layer comprising the semiconductor nanocrystals over at least a portion of the range of voltage to be applied to the device. The electroluminescent device of the invention is further characterized by its ease of fabrication, in comparison with prior art devices; and more efficient electron transport rate through the semiconductor nanocrystal electron transport layer than through prior art electron transport layers.

Having thus described the invention what is claimed is:

1. An electroluminescent device comprising:
   a) hole processing means capable of injecting and transporting holes;
   b) electron transport means in contact with said hole processing means comprising one or more monolayers of semiconductor nanocrystals having an average cross-section no larger than about 20 nm.; and
   c) electron injecting means in contact with said electron transport means for injecting electrons into said electron transport means.

2. The electroluminescent device of claim 1 wherein said semiconductor nanocrystals comprise single crystal particles having an average cross-section no larger than about 10 nm.

3. The electroluminescent device of claim 1 wherein said semiconductor nanocrystals comprise single crystal particles having an average cross-section ranging in size from about 1 nm to about 10 nm.

4. The electroluminescent device of claim 1 wherein said semiconductor nanocrystals comprise group II-VI semiconductors.

5. The electroluminescent device of claim 1 wherein said semiconductor nanocrystals comprise group III-V semiconductors.

6. The electroluminescent device of claim 1 wherein said electron transport means comprises a plurality of layers of said semiconductor nanocrystals.

7. The electroluminescent device of claim 1 wherein said hole processing means are transparent to visible light.

8. The electroluminescent device of claim 7 wherein said hole processing means comprise a hole injection layer and a hole transport layer between said hole injection layer and said electron transport layer.

9. The electroluminescent device of claim 1 wherein said electron transport means comprises one or more monolayers of one size of said semiconductor nanocrystals and one or more monolayers of at least one other size of said semiconductor nanocrystals.

10. The electroluminescent device of claim 1 wherein said electron transport means comprises one or more monolayers of semiconductor nanocrystals containing a mixture of two or more sizes of said semiconductor nanocrystals.

11. The electroluminescent device of claim 1 wherein said electron transport means comprises one or more monolayers of one type of said semiconductor nanocrystals and one or more monolayers of at least one other type of said semiconductor nanocrystals.

12. The electroluminescent device of claim 1 wherein said electron transport means comprises one or more monolayers of semiconductor nanocrystals containing a mixture of two or more types of said semiconductor nanocrystals.

13. The electroluminescent device of claim 1 wherein said electron injection means are transparent to visible light.

14. The electroluminescent device of claim 1 wherein said hole processing means comprise one or more layers not transparent to visible light and said electron injection means comprise a layer not transparent to visible light, and light emitted by said device is viewed from an end edge of said non-transparent layers comprising a side of said device.

15. An electroluminescent device capable of emitting visible light of a particular wavelength upon application of a voltage thereto, which comprises:
   a) hole processing means capable of injecting and transporting holes;
   b) an electron transport layer in contact with said hole processing means comprising one or more monolayers of semiconductor nanocrystals capable of emitting visible light of a particular wavelength and having an average cross-section no larger than about 20 nm.; and
   c) an electron injecting layer in contact with said electron transport layer for injecting electrons into said electron transport layer.

16. The electroluminescent device of claim 15 wherein either said hole processing means or said electron injecting layer is transparent to said visible light emitted by said semiconductor nanocrystal electron transport layer therebetween to thereby permit viewing of said emitted light.

17. An electroluminescent device characterized by the capability of emitting visible light of varying wavelengths based on variations in voltage applied thereto and comprising:
   a) a hole injection layer;
   b) a hole transport layer in contact with said hole injecting layer for transporting therethrough said holes injected therein;
   c) an electron transport layer in contact with said hole transport layer comprising one or more layers of semiconductor nanocrystals comprising single crystal semiconductor material having a particle size of not more than about 10 nm.; and c) an electron injecting layer in contact with said electron transport layer for injecting electrons into said electron transport layer.

18. The electroluminescent device of claim 17 wherein said semiconductor nanocrystals have a particle size range of from about 1 nm. to about 10 nm.

19. The electroluminescent device of claim 17 wherein said semiconductor nanocrystals are selected from the group consisting of group II-VI semiconductors and group III-V semiconductors.

20. The electroluminescent device of claim 17 wherein said hole injection layer, said hole transport layer, and said electron transport layer are transparent to visible light.

21. The electroluminescent device of claim 17 wherein said hole injection layer comprises a conductive layer capable of injecting holes into said hole transport layer.

22. The electroluminescent device of claim 17 wherein said hole transport layer comprises a polymeric layer capable of transporting holes injected therein by said hole injection layer.

23. The electroluminescent device of claim 17 wherein said electron injection layer comprises a metal layer capable of injecting electrons into said electron transport layer comprising said semiconductor nanometer crystals.

24. The electroluminescent device of claim 17 wherein said electron injection layer is transparent to visible light.

25. An electroluminescent device characterized by the capability of emitting visible light of varying wavelengths based on variations in voltage applied thereto and comprising:

a) a hole injection layer, comprising a conductive layer capable of injecting holes into said device;

b) a hole transport layer in contact with said hole injecting layer for transporting therethrough said holes injected therein;

c) an electron transport layer in contact with said hole transport layer comprising one or more layers of semiconductor nanocrystals selected from the group consisting of group II-VI semiconductors and group III-V semiconductors, and comprising single crystal semiconductor material having a particle size of not more than about 10 nm.; and c) an electron injecting layer in contact with said electron transport layer and comprising a metal layer capable of injecting electrons into said electron transport layer comprising said semiconductor nanocrystals;

wherein at least one of said layers is transparent to visible light.

26. The electroluminescent device of claim 25 wherein said hole injection layer, said hole transport layer, and said electron transport layer are transparent to visible light.

27. The electroluminescent device of claim 25 wherein said electron injection layer is transparent to visible light.

28. The electroluminescent device of claim 25 wherein said hole injection layer comprise a conductive layer selected from the group consisting of indium tin oxide, gold, zinc oxide and a p-type semiconductor with a band gap greater than 3 eV.

29. The electroluminescent device of claim 25 wherein said hole transport layer comprise a polymeric layer capable of transporting holes injected therein by said hole injection means.

30. The electroluminescent device of claim 25 wherein said electron injection layer comprise a metal layer selected from the group consisting of magnesium, calcium, strontium, barium, indium, and aluminum.

31. The electroluminescent device of claim 25 wherein said electron transport layer comprises semiconductor nanocrystals selected from the group consisting of MgS, MgSe, MgTe, CaS, CaSe, CaTe, SrS, SrSe, SrTe, BaS, BaSe, BaTe, ZnS, ZnSe, ZnTe, CdS, CdSe, CdTe; HgS, HgSe, HgTe, GaSh, InAs, InP, and InSb; and mixtures of two or more of said semiconductor compounds.

32. The electroluminescent device of claim 25 wherein said electron transport layer comprises semiconductor nanocrystals selected from the group consisting of ZnS, ZnSe, ZnTe, CdS, CdSe, CdTe; HgS, HgSe, HgTe, GaSh, InAs, InP, and InSb: and mixtures of two or more of said semiconductor compounds.

33. A method of making an electroluminescent device comprising:

a) forming hole processing means capable of injecting and transporting holes;

b) forming electron transport means in contact with said hole processing means comprising one or more monolayers of semiconductor nanocrystals capable of emitting light and having an average cross-section no larger than about 20 nm.; and c) forming electron injecting means in contact with said electron transport means for injecting electrons into said electron transport means.

34. A flat-panel display for providing an image utilizing emitted light from a plurality of electroluminescent devices, said display comprising:

a) a plurality of electroluminescent devices arranged in an array, each of said electroluminescent devices comprising:

i) hole processing means capable of injecting and transporting holes;

ii) an electron transport layer in contact with said hole processing means comprising one or more monolayers of semiconductor nanocrystals having an average cross-section no larger than about 20 nm.; and iii) an electron injecting layer in contact with said electron transport layer for injecting electrons into said electron transport layer;

b) a first electronic control input unit capable of receiving one or more input signals and operably coupled to said array of electroluminescent devices; and c) a second electronic control input unit also capable of receiving one or more input signals and also operably coupled to said array of electroluminescent devices;

whereby said first and second electronic control input units are arranged to provide voltages across preselected portions of said array of electroluminescent devices, in response to said input signals, to provide said image.

35. The flat-panel display device of claim 34 wherein said first and second electronic control input units each comprise a plane of parallel electrodes, said parallel electrodes of said first electronic control input unit being perpendicular to said parallel electrodes of said second control input unit, and said array of electroluminescent devices is located between said respective planes of parallel electrodes of said first and second control input units.

36. The flat-panel display device of claim 35 wherein at least one of said first and second electronic control input units receives an active matrix drive signal addressing data to drive at least a portion (240 rows by 640 columns) of a video graphics array (VGA).

37. The flat-panel display device of claim 34 wherein said semiconductor nanocrystals comprise single crystal particles having an average cross-section ranging in size from about 1 nm. to about 20 nm.

38. The flat-panel display device of claim 34 wherein said semiconductor nanocrystals comprise single crystal particles having an average cross-section ranging in size from about 1 nm. to about 10 nm.

39. The flat-panel display device of claim 38 wherein said semiconductor nanocrystals comprise group II-VI semiconductors.

40. The flat-panel display device of claim 38 wherein said semiconductor nanocrystals comprise group III-V semiconductors.

41. The flat-panel display device of claim 38 wherein said electron transport layer comprises a plurality of layers of said semiconductor nanocrystals.

42. The flat-panel display device of claim 38 wherein said hole processing means are transparent to visible light.

43. The flat-panel display device of claim 42 wherein said hole processing means comprise a hole injection layer, and a hole transport layer between said hole injection layer and said electron transport layer.

44. The flat-panel display device of claim 38 wherein said electron transport layer comprises one or more monolayers of one size of said semiconductor nanocrystals and one or more monolayers of at least one other size of said semiconductor nanocrystals.

45. The flat-panel display device of claim 38 wherein said electron transport layer comprises one or more monolayers of semiconductor nanocrystals containing a mixture of two or more types of said semiconductor nanocrystals.

46. The flat-panel display device of claim 38 wherein said electron transport layer comprises one or more monolayers of one type of said semiconductor nanocrystals and one or more monolayers of at least one other type of said semiconductor nanocrystals.

47. The flat-panel display device of claim 38 wherein said electron injection layer is transparent to visible light.

48. An electroluminescent device comprising:
   a) hole processing means capable of injecting and transporting holes;
   b) electron transport means in contact with said hole processing means comprising one or more monolayers of inorganic semiconductor nanocrystals; and
   c) electron injecting means in contact with said electron transport means for injecting electrons into said electron transport means.

49. A method of making an electroluminescent device comprising:
   a) forming hole processing means capable of injecting and transporting holes;
   b) forming electron transport means in contact with said hole processing means comprising one or more monolayers of inorganic semiconductor nanocrystals capable of emitting light; and
   c) forming electron injecting means in contact with said electron transport means for injecting electrons into said electron transport means.

50. A flat-panel display for providing an image utilizing emitted light from a plurality of electroluminescent devices, said display comprising:
   a) a plurality of electroluminescent devices arranged in an array, each of said electroluminescent devices comprising:
      i) hole processing means capable of injecting and transporting holes;
      ii) an electron transport layer in contact with said hole processing means comprising one or more monolayers of inorganic semiconductor nanocrystals; and
      iii) an electron injecting layer in contact with said electron transport layer for injecting electrons into said electron transport layer;
   b) a first electronic control input unit capable of receiving one or more input signals and operably coupled to said array of electroluminescent devices; and
   c) a second electronic control input unit also capable of receiving one or more input signals and also operably coupled to said array of electroluminescent devices;
whereby said first and second electronic control input units are arranged to provide voltages across preselected portions of said array of electroluminescent devices, in response to said input signals, to provide said image.

* * * * *